United States Patent [19]

Hasuo

[11] Patent Number: 4,506,172
[45] Date of Patent: Mar. 19, 1985

[54] DECODER CIRCUIT UTILIZING JOSEPHSON DEVICES

[75] Inventor: Shinya Hasuo, Yokohama, Japan

[73] Assignee: Fujitsu Limited, Kawasaki, Japan

[21] Appl. No.: 632,696

[22] Filed: Jul. 23, 1984

Related U.S. Application Data

[63] Continuation of Ser. No. 290,976, Aug. 7, 1981, abandoned.

[30] Foreign Application Priority Data

Sep. 12, 1980 [JP] Japan .................. 55-126871
Sep. 12, 1980 [JP] Japan .................. 55-126872

[51] Int. Cl.³ .......................................... H03K 19/195
[52] U.S. Cl. ..................... 307/462; 307/463; 307/306; 365/162
[58] Field of Search .............. 307/462, 463, 476, 277, 307/306; 357/5; 365/162

[56] References Cited

U.S. PATENT DOCUMENTS 4,198,577  4/1980  Faris .................................. 307/463

OTHER PUBLICATIONS

H. H. Zappe, "Modular Tree Decoder" IBM Technical Disclosure Bulletin vol. 20, No. 5, Oct. 1977, pp. 2024-2025.

Primary Examiner—John Zazworsky
Attorney, Agent, or Firm—Staas & Halsey

[57] ABSTRACT

This invention discloses a decoder circuit utilizing Josephson devices where Josephson AND gates, output lines connecting both terminals of each said Josephson device and an input signal line are provided in as many as $2^n$ in number in the nth stage of plural stages. The Josephson AND gate turns ON with the logical product (AND) of the current flowing into the output line of said Josephson AND gate of the preceding stage and the current flowing into the input signal line of the pertinent stage and causes a current to flow into the respective output line.

20 Claims, 4 Drawing Figures

DECODER CIRCUIT UTILIZING JOSEPHSON DEVICES

This application is a continuation of application Ser. No. 290,976, filed Aug. 7, 1981, now abandoned.

BACKGROUND OF THE INVENTION (1) Field of the Invention

This invention relates to a decoder circuit utilizing the Josephson device.

(2) Description of the Prior Art

The existing decoders of Josephson memory circuits are classified into several kinds, but each decoder is basically composed of a combination of current flip-flop circuits one of which is shown in FIG. 1. In the current flip-flop, when an input signal current $S_1$ is applied to the Josephson junction $J_1$ in the left side while a bias current $I_B$ flows through the Josephson junction, this junction momentarily acquires a voltage state and the bias current $I_B$ essentially flows through the junction $J_2$ in the right side. When an input current $S_2$ flows, on the contrary, to the junction $J_2$ in the right side, the bias current $I_B$ essentially flows through the left side junction $J_1$. In any case, the junctions $J_1$, $J_2$ are connected in parallel, and when the one is in the voltage state, the other is in the supercurrent state. Therefore, when one is returned to the supercurrent state, the current path is switched. A combination of such current flip-flops forms the so called tree decoder as shown in FIG. 2 which is demonstrated in the IEEE J. Solid State Circ., Vol. SC-13, No. 5, PP. 591-600, 1978 by W. H. Henkels and H. Zappe. The circuit shown in FIG. 2 is an example of the 8-bit address decoder, where a current flows in one of the address lines $AL_1$ to $AL_8$ according to the 3-bit input signals $A_1$, $A_2$, $A_3$. For example, when the address bit $A_1$ is 1, the junction $J_1$ becomes ON (voltage state) and the current $I_B$ flows in the branch including the junction $J_2$. When the address bit $A_2$ is 0, the inverted bit $\overline{A_2}$ is 1 and therefore the junction $J_6$ becomes ON, causing the current $I_B$ to flow into the branch including the junction $J_5$. Moreover, when the address bit $A_3$ is 1, the junction $J_{11}$ becomes ON and the current flows in the address line $AL_6$ including the junction $J_{12}$ ($AL_6$ is selected). The desired one address line among $2^n$ lines can be selected in this way with an input signal of n-bits. The loop decoder is also proposed in the IEEE J. Solid State Circ. Vol. SC-14, No. 4, PP. 699-707, 1979 by S. Faris as another type of decoder circuit. These decoder circuits are all composed of combinations of current flip-flop circuits or modified circuits. But the current flip-flop has as a load the superconducting loop inductance from the point of view of the Josephson junction. For this reason, such a decoder circuit has the disadvantage that if the address lines $AL_1$ to $AL_8$ become long, a longer period is required for switching the branch circuit of the current $I_B$. In practice, the switching period is on the order of nanosecond and the decoder circuit utilizing such current flip-flops cannot sufficiently utilize the high speed characteristic (several 10 PS) of the Josephson device.

SUMMARY OF THE INVENTION

It is an object of the present invention to provide a decoder circuit which assures a high operation speed. It is another object of the present invention to provide a decoder circuit which has reduced the number of wirings and resultingly is suitable for realization of higher integration density. In the decoder circuit of the present invention for attaining such objects including the Josephson device is a Josephson AND gate, $2^n$ output lines respectively connecting both ends of each Josephson device and the input signal lines are provided in the nth stage, so that each gate becomes ON with the logical product (AND) of the current flowing in the output line of the preceding stage and the input signal current flowing thereto, and a current flows into the respective output line.

DETAILED DESCRIPTION OF THE PREFERRED EMBODIMENTS

Figure 1:
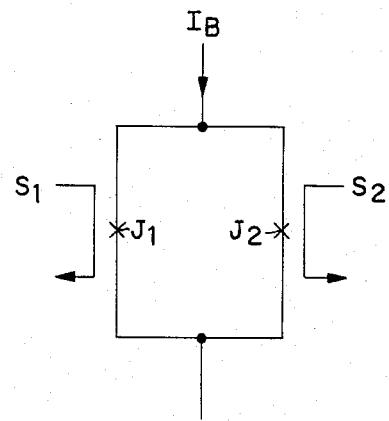
FIG. 1 shows the equivalent circuit of the current flip-flop utilizing the Josephson devices.
Figure 2:
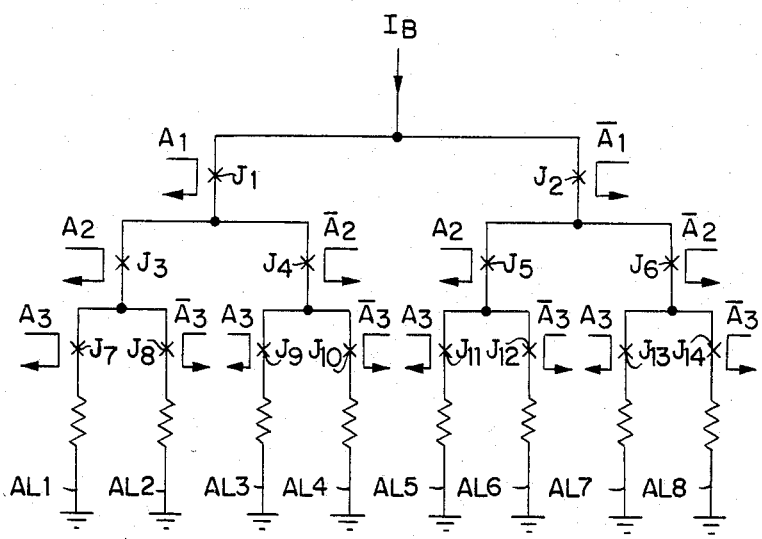
FIG. 2 shows the equivalent circuit of the existing tree decoder circuit utilizing a current flip-flop shown in FIG. 1.
Figure 3:
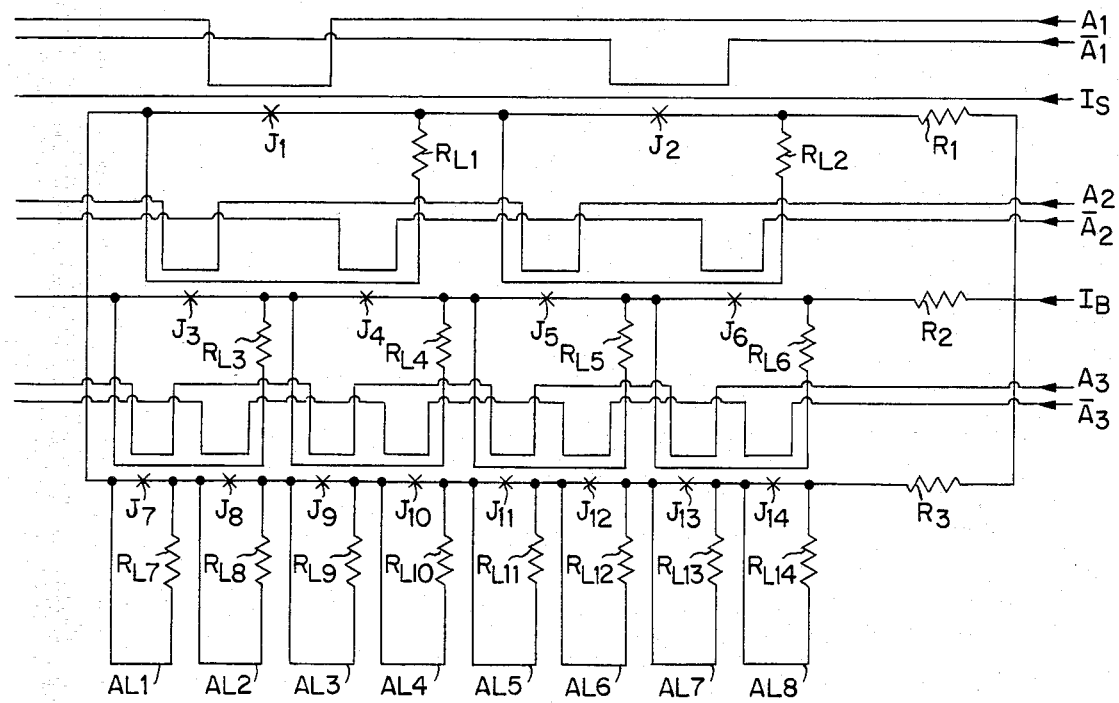
FIG. 3 shows an embodiment of the present invention.
Figure 4:
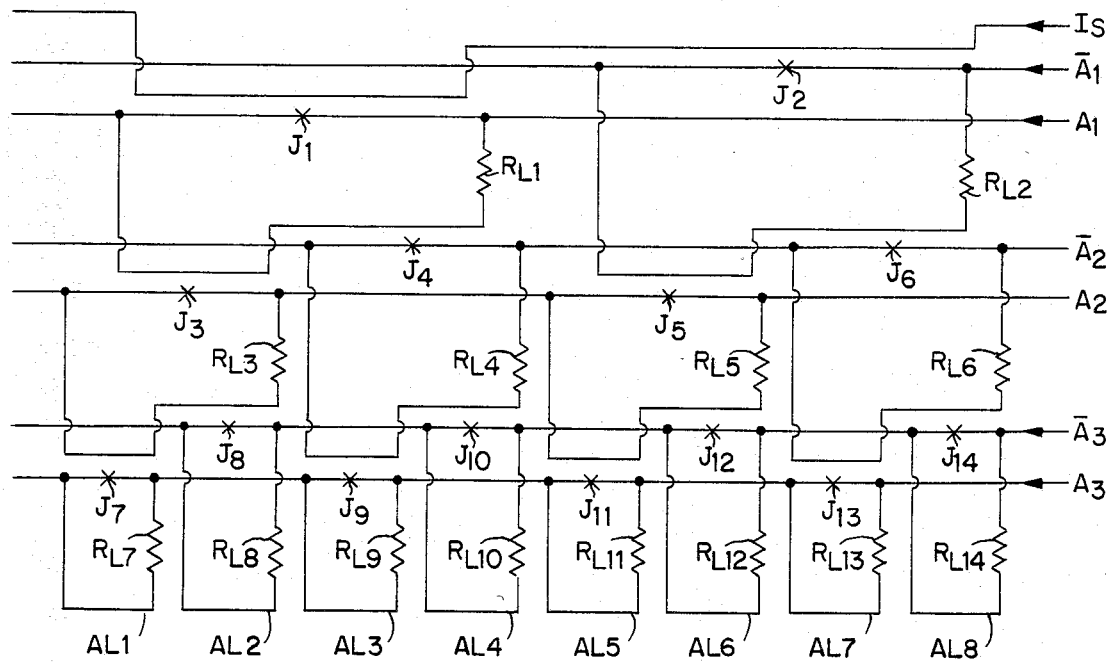
FIG. 4 shows another embodiment of the present invention.

FIG. 3 shows the equivalent circuit of an embodiment of the present invention, which is an example of the circuit where the 8-bit address lines $AL_1$ to $AL_8$ are selected by the 3-bit input signals $A_1$ to $A_3$. In this example, the circuits, in which the Josephson devices respectively having the 2-input AND function are serially connected, are provided in three stages, where the 1st stage includes two devices $J_1$, $J_2$ while the 2nd stage has four devices $J_3$ to $J_6$ and the 3rd stage has eight devices $J_7$ to $J_{14}$. In the 1st stage, the input signal A is applied to the device $J_1$ while the inverted signal $\overline{A}_1$ of the signal $A_1$ ($A_1$'s complement) is applied to the device $J_2$, and moreover the signal $I_s$ for starting the decoding is applied in common to the devices $J_1$ and $J_2$. An output of device $J_1$ is given to the devices $J_3$ and $J_4$ in the 2nd stage, while an output of the device $J_2$ is given to the devices $J_5$ and $J_6$ of the 2nd stage. The input signal $A_2$ of the 2nd stage is applied to the devices $J_3$ and $J_5$, while the complement $\overline{A}_2$ is apppplied to the devices $J_4$ and $J_6$. At the 3rd stage an output of the device $J_3$ is applied to the devices $J_7$, $J_8$ while an output of device $J_4$ is applied to the devices $J_9$, $J_{10}$, an output of device $J_5$ to the devices $J_{11}$, $J_{12}$ and an output of device $J_6$ to the devices $J_{13}$, $J_{14}$ as explained above. On the other hand, the input signal $A_3$ of the 3rd stage is applied to the devices $J_7$, $J_9$, $J_{11}$ and $J_{13}$, and the complement $\overline{A}_3$ to the devices $J_8$, $J_{10}$, $J_{12}$ and $J_{14}$. These devices $J_1$ to $J_{14}$ are respectively 2-input Josephson AND gates and these become ON (voltage state) only when the two inputs are 1. The resistors $R_{L1}$ to $R_{L14}$ are load resistors and $R_1$ to $R_3$ are bias current dividing resistors. In this example, as the bias power supply, the desired bias current $I_B$ is supplied as illustrated in common to each stage through the resistors $R_1$ to $R_3$, but this may be changed as desired. For example, the bias power supply may be respectively provided to each stage. Then, the operation when ($A_1$, $A_2$, $A_3$)=(1, 0, 1) will be explained below. When this input signal is given and the decoding start signal $I_s$ is applied, the device $J_1$ is first switched to the voltage state (ON) when $A_1=1$, $I_S=1$ and an output is given to the devices $J_3$ and $J_4$ in the 2nd stage. At this time, since $\overline{A}_2=1$, the device $J_4$ is switched ON in the 2nd stage and an output is given to the devices $J_9$ and $J_{10}$ in the 3rd stage. As a result, the device $J_9$ which receives said output and the signal of $A_3=1$ is switched and thereby only the address line $AL_3$ is selected. In the above operation, it is important that the devices $J_1$ to $J_{14}$ all operate with the latch operation and do not operate in the form of the current flip-flop. Therefore, the resistance values of the load resistors $R_{L1}$ to $R_{L14}$ are provided to match the characteristic impedance of the wirings and outstanding high speed selection of the address lines $AL_1$ to $AL_8$ can be realized (improvement of high speed operation by one order of magnitude can be realized as compared with the operation speed of the current flip-flop type). Although power consumption is certainly increased due to the latch operation, such increment of power consumption is sufficiently small as to be negligible for practical operation because only the n ON gates actually consume power. In the above embodiment, the decoding start signal $I_s$ is externally provided, but it can also be obtained by branching the bias current $I_B$ also as the signal $I_s$ on the signal line, or the signal $I_s$ can be omitted when the device $J_1$ of the first stage is formed as an OR gate. In addition, the devices in each stage are connected in series in the above embodiment, but these can also be connected in parallel by dividing the bias current $I_B$. Furthermore, even in the case of the series connection, it is desirable to insert a resistor between the elements in view of the realizing reliable operation of elements. For the devices $J_1$ to $J_{14}$, a discrete junction element, a two-junction quantum interference device or a three-junction quantum interference device may be employed, so long as each plays the role of the 2-input AND function. FIG. 4 shows the equivalent circuit indicating a further embodiment of the present invention which is an example of the circuit wherein the 8-bit address lines $AL_1$ to $AL_8$ are selected by the 3-bit external input signal $A_1$ to $A_3$. In this embodiment, the circuit has a staircase structure of three stages. In the 1st stage, 2 latch-type AND circuits (Josephson devices) $J_1$ to $J_2$ are provided, while four devices $J_3$ to $J_6$ are provided in the 2nd stage and eight devices $J_7$ to $J_{14}$ in the 3rd stage, thus 14 devices being provided in all. Each device is a 2-input AND circuit which receives an output of the preceding stage as the internal input signal and a respective one of the external input signals $A_1$ to $A_3$ and the complements $\overline{A}_1$ to $\overline{A}_3$ as the bias current, and switches to the ON (voltage) state when both inputs are 1. Namely, the external input signal $A_1$ causes a bias current to flow into the Josephson device $J_1$ and the $A_1$'s complement $\overline{A}_1$ causes a bias current to flow into the device $J_2$. The external input signal $A_2$ of the 2nd stage causes a bias current to flow into the devices $J_3$, $J_5$ while the complement $\overline{A}_2$ causes a bias current to flow into the devices $J_4$, $J_6$. In the same way, the external input signal $A_3$ of the 3rd stage causes a bias current to flow into the devices $J_7$, $J_9$, $J_{11}$, $J_{13}$ while the complement $\overline{A}_3$ causes the bias current to flow into the devices $J_8$, $J_{10}$, $J_{12}$ and $J_{14}$. On the other hand, an output of the device $J_1$ is given to the devices $J_3$, $J_4$ while an output of the device $J_2$ is given to the devices $J_5$, $J_6$ respectively as the internal input signal. Similarly, an output of the device $J_3$ is applied to the devices $J_7$, $J_8$ of the next stage, while an output of the device $J_4$ is to the devices $J_9$, $J_{10}$, an output of the device $J_5$ is to the devices $J_{11}$, $J_{12}$, an output of the device $J_6$ is to the devices $J_{13}$, $J_{14}$, respectively, as the internal input signals. Since no output of the preceding stage is given to the devices $J_1$ and $J_2$ of the 1st stage, the signal current $I_s$ for starting the decoding is given to them. Operation when the external input signals $A_1=1$, $A_2=0$, $\overline{A}_2=1$, for example, are fed will now be explained. When $I_s=1$ is given after the external inputs $A_1$ to $A_3$ are given, the device $J_1$ wherein the two inputs $A_1$ and $I_s$ are 1 is switched ON, outputting a signal to the devices $J_3$, $J_4$ of the next stage. At this time, since $A_2=0$ and resultingly $\overline{A}_2=1$, the device $J_4$ turns to voltage stage. In addition, an output of the device $J_4$ is given to the devices $J_9$ and $J_{10}$ of the 3rd stage, and since $A_3=1$, the device $J_9$ switches and, as a result, only the address line $AL_3$ including a load resistor $R_{L9}$ is selected. The gate used here switches only when both the bias current (here the external input signals $A_1$ to $A_3$ and the complements) and the input signal current (signal $I_s$ or an output of a preceding stage) are given simultaneously, and moreover said gate performs the latch operation. The characteristic impedance of the interconnection is matched to the load resistors $R_{L1}$ to $R_{L14}$ and thereby an improvement of high speed characteristic by about one order of magnitude is expected as compared with the existing decoder circuit. For the devices $J_1$ to $J_{14}$, not only the discrete junction device but also the two-junction quantum interference device or three junction quantum interference device, namely any Josephson device which has the AND function between the bias current and input signal may be used. Moreover, the decoding start signal $I_s$ can be omitted if the devices $J_1$, $J_2$ of the 1st stage are designed to be switched with the bias current. The Josephson junctions connected in series in each stage may also be connected in parallel. However, in the case of the parallel connection, the external input signal currents are increased as many times as the number of parallel connections. Therefore, the signal circuit must have a large driving capability.

As explained above, the present invention provides an advantage that the circuit can be formed with the strip lines terminated by the matching impedance because the latch type Josephson AND gates are used and moreover a high speed decoder circuit can be realized.

Particularly, the 2nd embodiment is superior in high density integration of elements because one of the two inputs is the bias current to be supplied to the Josephson junction and therefore only one signal line is required for field coupling to said junction and resultingly a lesser number of wirings are required.

What is claimed is:

1. A decoder circuit, comprising
    a plurality of sequentially connected stages,
    $2^n$ latch type Josephson devices in each nth one of said stages, wherein n varies from one to the number of said plurality of stages, and said Josephson devices of at least all but the first stage have a two-input AND function,
    each said stage providing a plurality of output signals on a respective plurality of output lines, with each said output line being connected across a respective one of said Josephson devices of the same stage,
    each said second and higher stage having as respective input signals to said Josephson devices thereof said output signals of the preceding stage, and
    means for providing a bias current to each said Josephson device and the respective output line, and a respective address signal to each said Josephson device according to the decoding to be performed.

2. The decoder circuit of claim 1, wherein said Josephson devices of the first stage are OR gates.

3. The decoder circuit of claim 1, comprising an external input signal line to provide a respective input signal to said Josephson devices of said first stage, and said Josephson devices of said first stage having a two-input AND function.

4. The decoder circuit of claim 1, wherein, for each said stage, all of the Josephson devices of the stage are connected in series.

5. The decoder circuit of claim 1, wherein, for each said stage, all of the Josephson devices of the stage are connected in parallel.

6. The decoder circuit of claim 1, comprising a respective pair of address signal lines respectively connected to supply said address signal inputs to the Josephson devices of each respective stage.

7. The decoder circuit of claim 6, comprising all of the Josephson devices of the stage being connected in series.

8. The decoder circuit of claim 1, wherein said means provides said respective bias current to each of said Josephson devices as a respective one of said address signals.

9. The decoder circuit of claim 1, comprising a resistor in each of said output lines connected across said Josephson devices to match the impedance of the respective output line.

10. The decoder circuit of claim 3, comprising a resistor in each of said output lines connected across said Josephson devices to match the impedance of the respective output line.

11. The decoder circuit of claim 4, comprising a resistor in each of said output lines connected across said Josephson devices to match the impedance of the respective output line.

12. The decoder circuit of claim 6, comprising a resistor in each of said output lines connected across said Josephson devices to match the impedance of the respective output line.

13. The decoder circuit of claim 8, comprising a resistor in each of said output lines connected across said Josephson devices to match the impedance of the respective output line.

14. The decoder circuit of claim 1, wherein the number of said Josephson devices in each said nth stage does not exceed $2^n$.

15. The decoder circuit of claim 3, wherein the number of said Josephson devices in each said nth stage does not exceed $2^n$.

16. The decoder circuit of claim 4, wherein the number of said Josephson devices in each said nth stage does not exceed $2^n$.

17. The decoder circuit of claim 6, wherein the number of said Josephson devices in each said nth stage does not exceed $2^n$.

18. The decoder circuit of claim 8, wherein the number of said Josephson devices in each said nth stage does not exceed $2n$.

19. The decoder circuit of claim 1, each said Josephson device having said two-input AND function being a two-input AND gate.

20. The decoder circuit of claim 8, said sequentially connected stages having a ladder structure.

* * * * *

UNITED STATES PATENT AND TRADEMARK OFFICE
CERTIFICATE OF CORRECTION

PATENT NO. : 4,506,172

DATED : MARCH 19, 1985

INVENTOR(S) : SHINYA HASUO

It is certified that error appears in the above-identified patent and that said Letters Patent is hereby corrected as shown below:

Col. 1, line 47, "n-bits" should be --n bits--;
      line 61, "PS" should be --pS--.
Col. 2, line 2, delete "including".

Signed and Sealed this

First Day of March, 1988

Attest:

DONALD J. QUIGG

Attesting Officer      Commissioner of Patents and Trademarks